(12) United States Patent
Matsuda

(10) Patent No.: US 8,514,312 B2
(45) Date of Patent: Aug. 20, 2013

(54) IMAGE SENSOR AND IMAGE-READING DEVICE

(75) Inventor: Jiro Matsuda, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 354 days.

(21) Appl. No.: 12/610,620

(22) Filed: Nov. 2, 2009

(65) Prior Publication Data

US 2010/0321552 A1  Dec. 23, 2010

(30) Foreign Application Priority Data

Jun. 23, 2009  (JP) ................. 2009-148597

(51) Int. Cl.
*H04N 3/14* (2006.01)
*H04N 5/335* (2011.01)

(52) U.S. Cl.
USPC ........................................... 348/316

(58) Field of Classification Search
USPC ............... 348/311, 312, 313, 314, 316, 317, 348/319, 320, 321, 322, 323, 324; 257/222, 257/223, 231, 232, 234, 241, 242, 249, 250; 358/471, 474, 482, 483, 484
See application file for complete search history.

(56) References Cited

U.S. PATENT DOCUMENTS

| | | | | |
|---|---|---|---|---|
| 4,380,056 A * | 4/1983 | Parrish et al. | ............... | 365/183 |
| 4,589,005 A | 5/1986 | Matsuda et al. | | |
| 5,379,067 A * | 1/1995 | Miura | ............... | 348/311 |
| 5,705,836 A * | 1/1998 | Agwani et al. | ............... | 257/221 |
| 7,053,357 B2 * | 5/2006 | Schwarte | ............... | 250/214.1 |
| 7,250,971 B2 * | 7/2007 | Yamada et al. | ............... | 348/316 |
| 7,671,391 B2 * | 3/2010 | Kawahito | ............... | 257/290 |
| 7,910,964 B2 * | 3/2011 | Kawahito et al. | ............... | 257/292 |
| 2007/0158770 A1 | 7/2007 | Kawahito | | |
| 2009/0114919 A1 * | 5/2009 | Kawahito et al. | ............... | 257/59 |

FOREIGN PATENT DOCUMENTS

| | | |
|---|---|---|
| JP | A-58-212176 | 12/1983 |
| JP | A-5-13746 | 1/1993 |
| JP | A-5-198602 | 8/1993 |
| JP | A-2005-166824 | 6/2005 |
| JP | A-2005-235893 | 9/2005 |
| JP | A-2007-336196 | 12/2007 |
| WO | WO 2007/119626 A1 | 10/2007 |

OTHER PUBLICATIONS

May 14, 2013 Office Action issued in Japanese Patent Application No. 2009-148597 (with English translation).

* cited by examiner

*Primary Examiner* — Aung S Moe
*Assistant Examiner* — Chriss Yoder, III
(74) *Attorney, Agent, or Firm* — Oliff & Berridge, PLC

(57) ABSTRACT

An image sensor includes: a charge generating unit that generates a charge in response to light, and has a potential well that stores the charge; a first charge storage unit the first charge storage unit having a potential well deeper than the potential well of the charge generating unit and storing a charge transferred from the charge generating unit; a first electrode covering an end of the charge generating unit, to which a voltage is applied, to form a gradient of a potential so that a charge stored in the charge generating unit is transferred to the first charge storage unit; and a second electrode covering a part of the charge generating unit, to which a voltage is applied to make a part of the potential well of the charge generating unit shallow, the shallow part corresponding to the part of the charge generating unit covered by the second electrode.

21 Claims, 8 Drawing Sheets

BEFORE VOLTAGE IS APPLIED
CCD POTENTIAL WELL   PIXEL POTENTIAL WELL   CCD POTENTIAL WELL

321:VH

321:VH
322:VH

321:VH
322:VH
323:VL

BEFORE VOLTAGE IS APPLIED

321A:VH
322A:VH
323A:VL

IMAGE SENSOR AND IMAGE-READING DEVICE

CROSS-REFERENCE TO RELATED APPLICATIONS

This application is based on and claims priority under 35 USC 119 from Japanese Patent Application No. 2009-148597 filed on Jun. 23, 2009.

BACKGROUND

1. Technical Field

The present invention relates to an image sensor and an image-reading device.

2. Related Art

In connection with an image-reading device using a CCD (Charge Coupled Device) image sensor, a technique is proposed for effectively transferring changes from pixels to transfer paths.

SUMMARY

An aspect of the prevent invention provides an image sensor including: a charge generating unit provided on a semiconductor substrate, that generates a charge in response to light, and has a potential well that stores the charge; a first charge storage unit provided on the semiconductor substrate next to the charge generating unit, facing a first aspect of the charge generating unit, the first charge storage unit having a potential well deeper than the potential well of the charge generating unit and storing a charge transferred from the charge generating unit; a first electrode covering an end of the charge generating unit having the first aspect, to which a voltage is applied, to form a gradient of a potential in an area between the charge generating unit and the first charge storage unit so that a charge stored in the charge generating unit is transferred to the first charge storage unit; and a second electrode covering a part of the charge generating unit, and provided away from the first charge storage unit as compared with the first electrode, to which second electrode a voltage is applied to make a part of the potential well of the charge generating unit shallow, the shallow part corresponding to the part of the charge generating unit covered by the second electrode.

BRIEF DESCRIPTION OF THE DRAWINGS

Exemplary embodiments of the present invention will be described in detail below with reference to the following figures, wherein.

DETAILED DESCRIPTION

Exemplary embodiments of the present invention will be described.

First Exemplary Embodiment

[Configuration]

Figure 1:
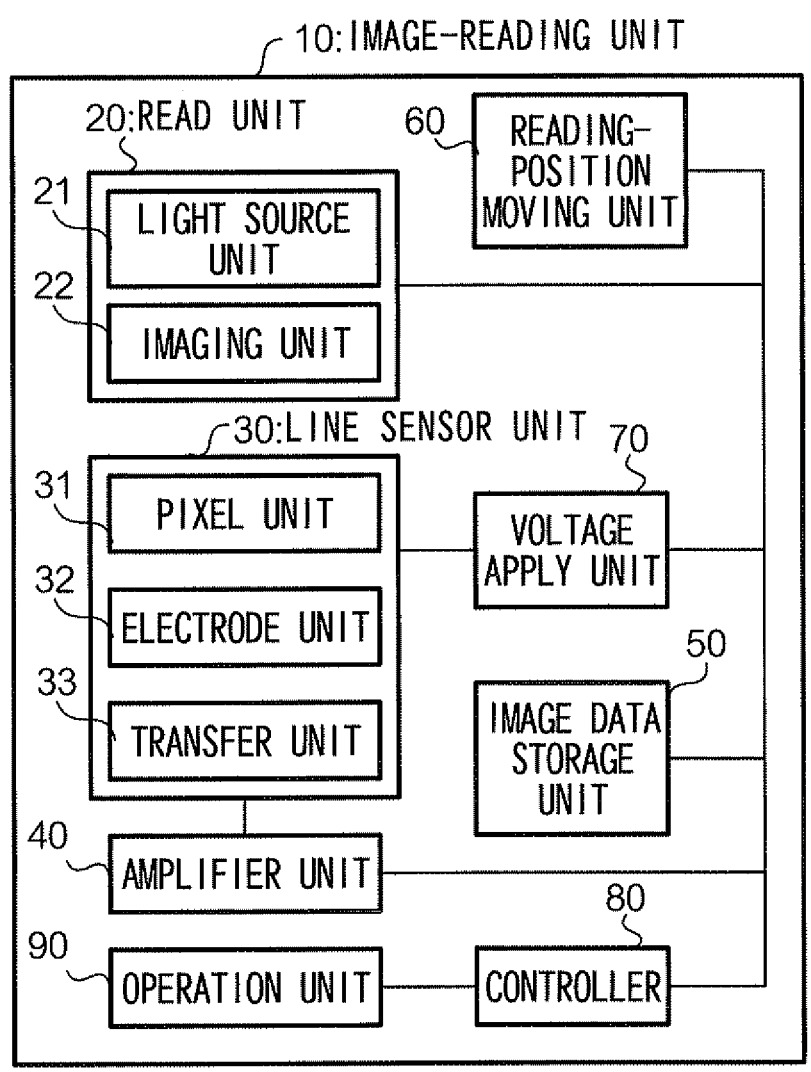
FIG. 1 is a block diagram showing a configuration of image-reading device 10 according to a first exemplary embodiment.

FIG. 1 is a block diagram showing a configuration of image-reading unit 10 such as a scanner, according to the present exemplary embodiment. Read unit 20 includes light source unit 21 and imaging unit 22. Light source unit 21 emits light to a document placed on a platen (not shown). Imaging unit 22 causes line sensor unit 30 to form an image on the basis of light reflected by the document, using an optical lens and a reflecting mirror. Line sensor unit 30 carries out a photoelectric conversion on the basis of the reflected light, and transfers charges to amplifier unit 40. The configuration of line sensor unit 30 will be described in detail later. Amplifier unit 40 amplifies charges transferred from line sensor unit 30, converts the amplified charges into image signals, and outputs the image signals to controller 80. Image data storage unit 50 stores image data representing an image generated by controller 80 on the basis of image signals.

Reading-position moving unit 60 has a function of moving line sensor unit 30 so that a position of line sensor unit 30 is changed relative to a document. It is to be noted that a document may be moved so that a position of line sensor unit 30 is changed relative to the document. Voltage apply unit 70 has a function of applying a voltage to electrode unit 32 of line sensor unit 30. Voltage apply unit 70 also has a function of applying a voltage to transfer unit 33 of line sensor unit 30 under control of controller 80, thereby causing transfer unit 33 to transfer charges to amplifier unit 40. Controller 80 includes a processor such as a CPU (Central Processing Unit) and a storage unit such as a memory, and controls operations of the above-mentioned units. Operation unit 90 includes an interface such as a touch panel or buttons, and receives a selection of an operation mode of image-reading device 10 or an input of setting data.

Figure 2:
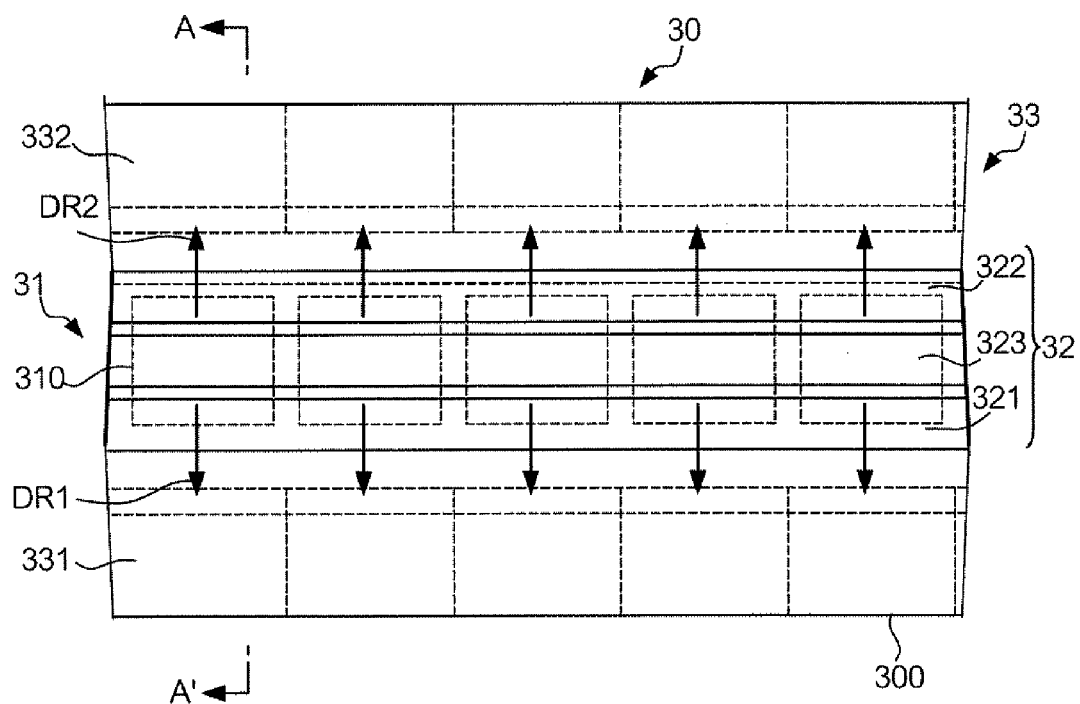
FIG. 2 is a diagram showing an overview of line sensor unit 30 according to a first exemplary embodiment.

FIG. 2 is a diagram showing a part of a configuration of line sensor unit 30. In the drawing, an only configuration relating to an operation of the present exemplary embodiment is shown. Pixel unit 31 includes plural photoelectric conversion elements (hereinafter referred to as "pixels 310") constituting pixels. Pixels 310 are charge generating units that generate charges in response to light, and store the charges. Pixels are arranged so that they form a line. Electrode unit 32 includes optically-transparent read electrodes 321, 322, and 323. If a predetermined voltage is applied to each of read electrodes 321, 322, and 323, a potential changes as will be described later, and charges stored in each pixel 310 are transferred to CCD elements 331 and 332 (described later).

Transfer unit 33 includes plural CCD elements 331 and 332 that store charges. CCD elements 331 and 332 are arranged adjacent to pixel 310 so that each pixel 310 is sandwiched between CCD element 331 and CCD element 332. CCD elements 331 and 332 are also arranged so that each set of elements forms a line. The elements serve as a transfer path of charges. If a voltage is applied to an electrode (not shown) from voltage apply unit 70 in a predetermined manner, charges transferred from pixels 310 to CCD elements 331 and 332 are further transferred from CCD elements 331 and 332 to amplifier unit 40.

Figure 3:
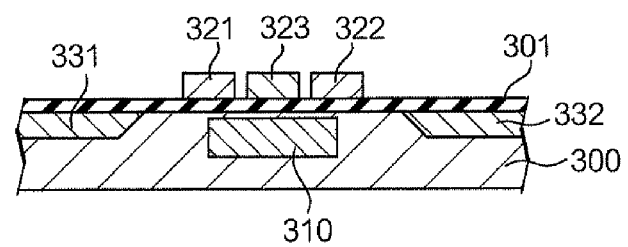
FIG. 3 is a cross-sectional view of line sensor unit 30 along line A-A' of FIG. 2, as viewed along the direction of arrows A and A'.

FIG. 3 is a cross-sectional view of line sensor unit 30 along line A-A' of FIG. 2, as viewed along the direction of arrows A and A'. Substrate 300 is a semiconductor substrate made of, for example, a silicon, on which pixels 310 and CCD elements 331 and 332 are deposited. Insulating film 301 is an insulating film 301 deposited on a surface of substrate 300. Read electrodes 321, 322, and 323 are deposited on insulating film 301.

[Operation]

To explain an operation by which charges are transferred from pixels 310 to CCD elements 331 and 332 in line sensor unit 30 having the above-mentioned configuration, an effect of read electrode 321 will be described.

FIGS. 4A to 4D are diagrams of a potential measured relative to substrate 300 located around pixel 310 and CCD elements 331 and 332. In the drawings, a lower potential is indicated by a downward position. Before a voltage is applied to electrode unit 32, a potential well is formed in each area of pixel 310, and CCD elements 331 and 332. A potential well formed in an area of pixel 310 will be referred to as "pixel potential well," and a potential well formed in each area of CCD elements 331 and 332 will be referred to as "CCD potential well." A CCD potential well is deeper than a pixel potential well. In other words, a potential at the bottom of a CCD potential well is lower than a potential at the bottom of a pixel potential well. If light is emitted to pixel 310, charges generated by a photoelectric conversion are stored in a pixel potential well, as described in FIG. 4A.

Subsequently, if controller 80 causes voltage apply unit 70 to apply a voltage to read electrode 321, a potential of an area affected by read electrode 321 (hereinafter referred to as "read potential") changes. Now, a voltage applied to read electrode 321 is defined as voltage VH (a voltage relative to substrate 300), that has a voltage value for making a read potential lower than a potential at the bottom of a pixel potential well, and higher than a potential at the bottom of a CCD potential well.

Figure 4A:
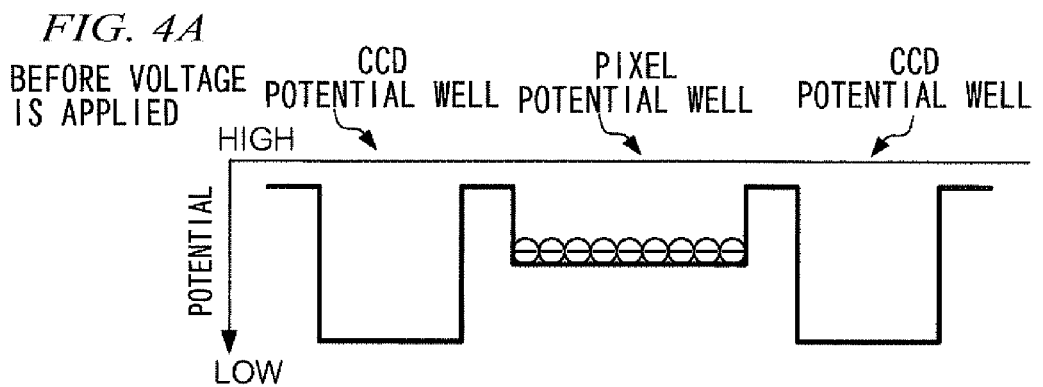
FIGS. 4A to 4D are diagrams showing an example of a potential measured around a pixel unit, an electrode unit, and a transfer unit shown in FIG. 2.
Figure 4B:
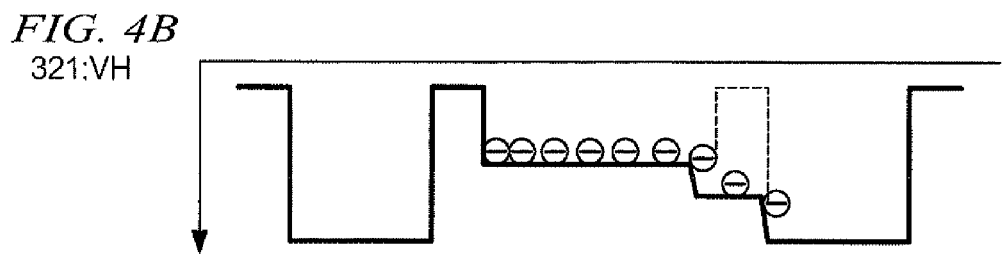

If voltage VH is applied to read electrode 321, a gradient of a potential (hereinafter referred to as "potential gradient") is generated, which extends from pixel 310 to CCD element 331. As a result, charges stored in pixel 310 move to CCD element 331, as shown in FIG. 4B. The direction of the movement of the charges (charge moving direction) is indicated by arrow DR1 that extends from pixel 310 toward CCD element 331 in FIG. 2. To summarize, if voltage VH is applied to read electrode 321, charges are transferred to CCD element 331.

Figure 4C:
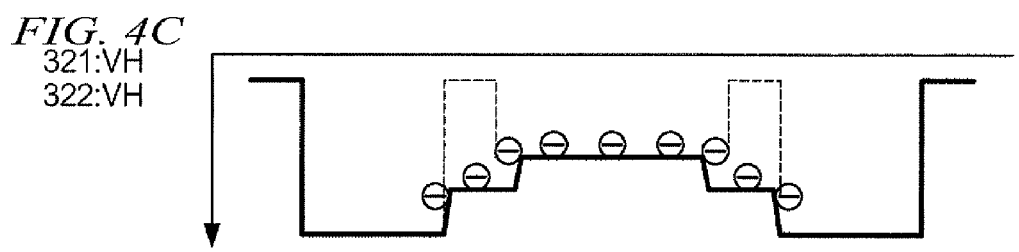
Figure 4D:
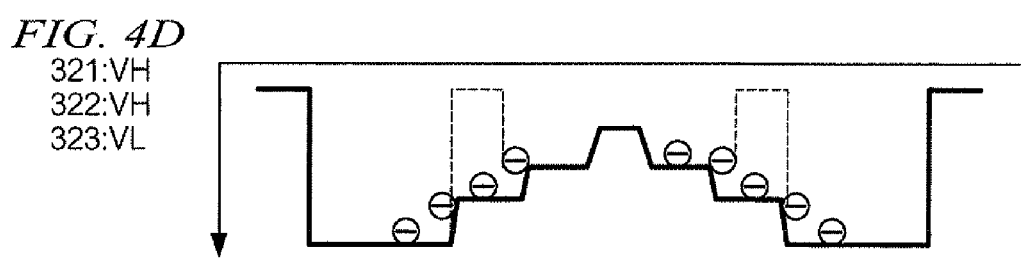

On the other hand, if voltage VH is applied to read electrode 322, a potential gradient is generated that extends toward CCD element 332, and as a result, charges stored in pixel 310, at the side of read electrode 322, move in a direction of arrow DR2 shown in FIG. 2 (charge moving direction), as shown in FIG. 4C. In addition, if voltage VL is applied to read electrode 323, that has a voltage value for making a read potential higher than a potential at the bottom of a pixel potential well, a potential gradient is generated in an area of pixel 310, which is formed by a read potential of read electrode 323, a potential at the bottom of a pixel potential well, and read potentials of read electrodes 321 and 322, arranged in series. The potential gradient has a larger difference in height and a shorter distance of movement of charges than the above-mentioned potential gradient generated using read electrode 321, as shown in FIG. 4D.

Figure 5A:
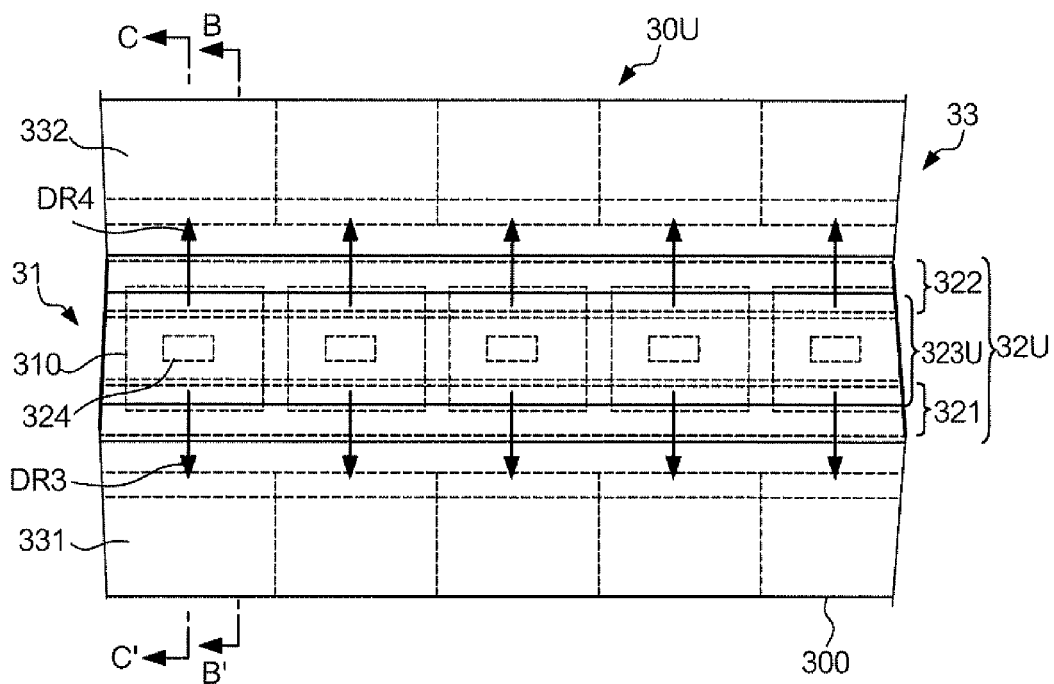
FIGS. 5A to 5C are diagrams showing an overview of line sensor unit 30U having read electrode 323U, instead of read electrode 323 of a first exemplary embodiment.
Figure 5B:
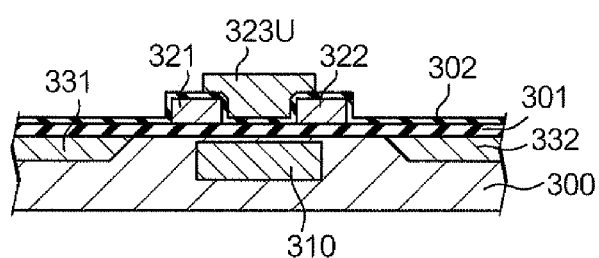
Figure 5C:
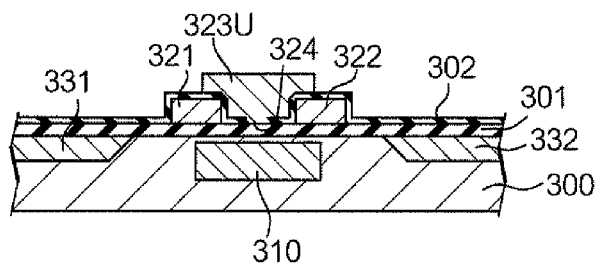

It is to be noted that in the present exemplary embodiment where read electrode 323 is formed in a layer identical to that in which read electrodes 321 and 322 are formed, as shown in FIG. 3, read electrode 323U may be used instead of read electrode 323, that is insulated from read electrodes 321 and 322 by insulating film 302, as shown in FIGS. 5A to 5C.

FIG. 5A is a diagram showing an overview of line sensor unit 30U including read electrode 323U. Electrode unit 32U includes read electrodes 321, 322, and 323U. FIG. 5B is a cross-sectional view of line sensor unit 30U along line B-B' of FIG. 5A, as viewed along the direction of arrows B and B'. Insulating film 302 is deposited on a surface each of insulating film 301 and read electrodes 321 and 322. Read electrode 323U is deposited on insulating film 302. Read electrode 323U is arranged in a space between read electrodes 321 and 322 so that read electrode 323U covers an end each of read electrodes 321 and 322 at the side of pixel 310.

FIG. 5C is a cross-sectional view of line sensor unit 30U along line C-C' of FIG. 5A, as viewed along the direction of arrows C and C'. As shown in FIGS. 5A and 5C, insulating film 302 has openings 324 each of which corresponds to pixel 310. Accordingly, read electrode 323U has a larger effect on a pixel potential well in an area having opening 324 than in other areas.

Second Exemplary Embodiment

[Configuration]

In the first exemplary embodiment, read electrodes 321 and 322 are formed so that an edge of an area of each read electrode covering pixel 310 forms an angle of approximately 90 degrees with a charge moving direction (DR1 or DR2). In this case, a steep part of a potential gradient is limited to an area corresponding to an edge of an area of a read electrode covering pixel 310. In contrast, in the present exemplary embodiment, read electrodes 321A and 322A are formed so that an edge of an area of each read electrode covering pixel 310 forms an angle of approximately 45 degrees with a charge moving direction (DR5 or DR6), as shown in FIG. 6A.

Figure 6A:
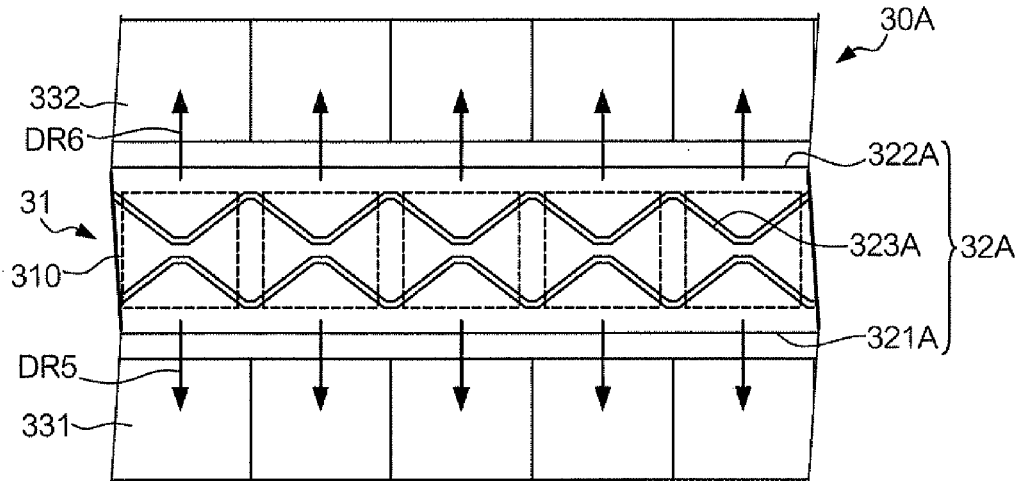
FIGS. 6A and 6B are diagrams showing an overview of line sensor 30A according to a second exemplary embodiment.
Figure 6B:
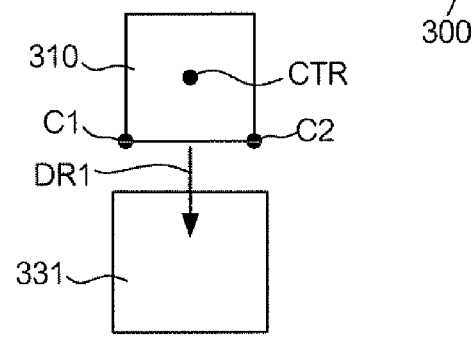

FIG. 6A is a diagram showing an overview of line sensor unit 30A according to the present exemplary embodiment. For convenience of explanation, corners of pixel 310 at the side of CCD element 331 are referred to as "corners C1 and C2," and the center of pixel 310 is referred to as "center CTR." as shown in FIG. 6B. Descriptions overlapping with those of the first exemplary embodiment will be omitted.

Read electrode 321A covers a side each of pixel 310 at the side of CCD element 331. Read electrode 321A is formed so that an edge of an area of the electrode covering pixel 310 is formed by a line extending from corner C1 of pixel 310 to center CTR, a line extending from corner C2 of pixel 310 to center CTR, and a line connecting the two lines at a point where a line does not reach center CTR. The edge of read electrode 321A is formed for each pixel 310; accordingly, read electrode 321A has a saw-like edge extending toward the center of pixel unit 31. Read electrode 322B is formed so that the electrode and read electrode 321A are symmetrical to a line connecting centers CTR of pixels 310. Read electrode 323A is sandwiched between read electrode 321A and read electrode 322A. Read electrode 323A is insulated from read electrodes 321A and 322A. Read electrode 323A has sawlike edges running along an edge of read electrodes 321A or 322A.

[Operation]

If the above-mentioned voltage VH is applied to read electrodes 321A and 322A, and the above-mentioned voltage VL is applied to read electrode 323A, since read electrodes 321A and 322A are formed so that an edge of an area of each read electrode covering pixel 310 forms a tilt angle, not an angle of 90 degrees, with a charge moving direction, a potential gradient is generated, extending from center CTR of pixel 310 to CCD elements 331 and 332. The potential gradient has an even slope as compared with that of the first exemplary embodiment.

Figure 7A:
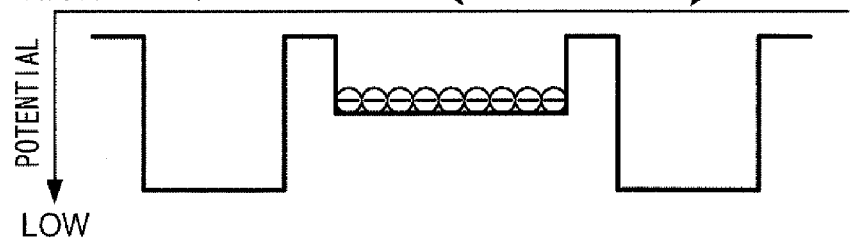
FIGS. 7A and 7B are diagrams showing an example of a potential measured around a pixel unit, an electrode unit, and a transfer unit shown in FIG. 6.
Figure 7B:
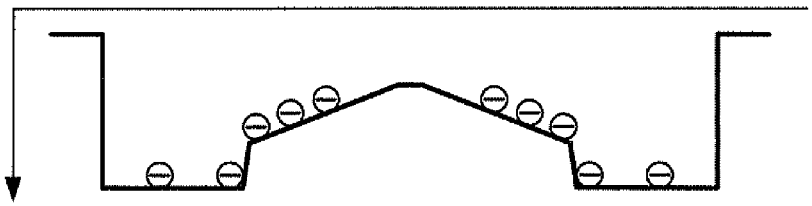

FIGS. 7A and 7B are diagrams showing a potential measured around a pixel unit, an electrode unit, and a transfer unit shown in FIG. 6. FIG. 7B shows the above-mentioned potential gradient having an even slope. According to the potential gradient, charges stored in pixel 310 easily move to CCD elements 331 and 332 as compared with the first exemplary embodiment.

In the present exemplary embodiment, read electrodes 321A and 322A are formed so that an edge of an area of each read electrode covering pixel 310, in particular a line extending from corner C1 or C2 to center CTR, forms an angle of approximately 45 degrees with a charge moving direction (DR5 or DR6), as described above. However, the angle formed by an edge of a read electrode and a charge moving direction may have any value other than 45 (degrees) as long as the value is neither 0 (degree) nor 90 (degrees). In other words, the angle may have any value as long as the value is larger than 0 (degree) and smaller than 90 (degrees), or larger than approximately 0 (degree) and smaller than approximately 90 (degrees), and a potential gradient has an even slope. Hereinafter such an angle will be simply referred to as a "tilt" angle.

Also, in the present exemplary embodiment, read electrodes 321A and 322A are formed so that most of an edge of an area of each read electrode covering pixel 310 forms a tilt angle with a charge moving direction. However, an edge of a read electrode forming a tilt angle with a charge moving direction may be only a small part of the edge as long as at least part of the edge forms a tilt angle with the charge moving direction.

Third Exemplary Embodiment

[Configuration]

In the first and second exemplary embodiment, read electrode 323 (323A) to which voltage VL is applied is arranged so that it is sandwiched between read electrode 321 (321A) and read electrode 322 (322A) to which voltage VH is applied. However, read electrodes may be provided to which both voltage VL and voltage VH are applied to each read electrode, as shown in FIG. 8A.

Figure 8A:
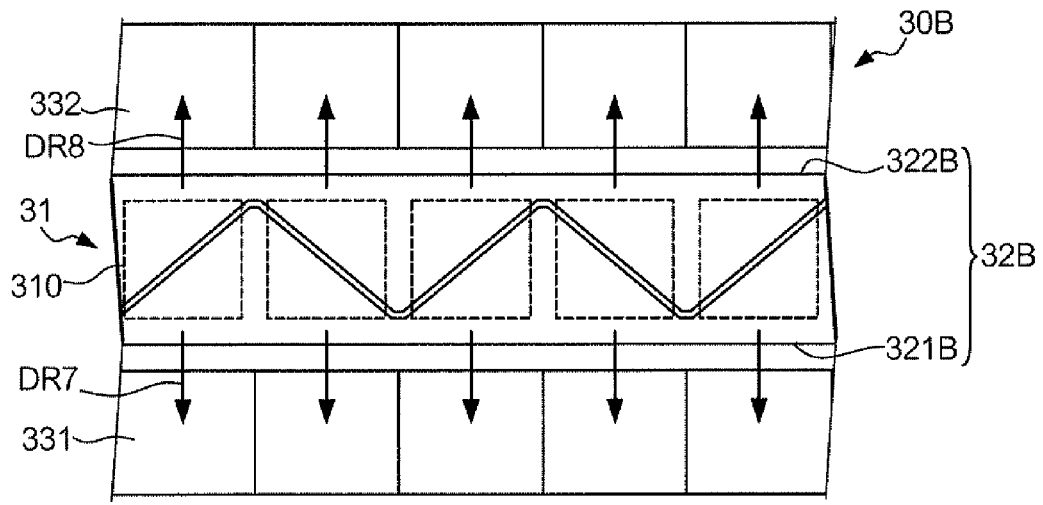
FIGS. 8A and 8B are diagrams showing an overview of line sensor 30B according to a third exemplary embodiment.
Figure 8B:
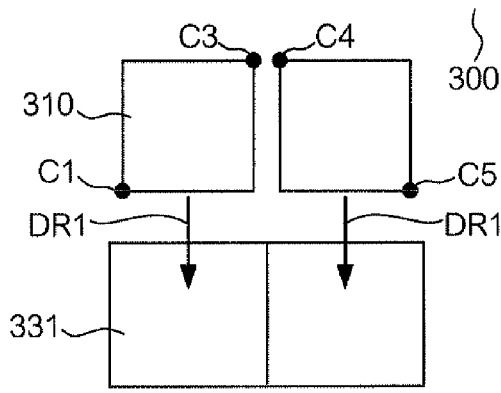

FIG. 8A is a diagram showing an overview of line sensor unit 30B according to the present exemplary embodiment. For convenience of explanation, a corner opposite corner C1 of pixel 310 is referred to as "corner C3," a corner adjacent to corner C3 of another pixel 310 is referred to as "corner C4," and a corner opposite corner C4 of the other pixel 310 is referred to as "corner C5," as shown in FIG. 8B. In line sensor unit 30B, read electrodes 321B and 322B are formed so that read electrode 321B covers an end of each of pixel 310 at the side of CCD element 331, and read electrode 322B covers an end each of pixel 310 at the side of CCD element 332. Read electrodes 321B and 322B are also formed so that they have a boundary substantially running along a diagonal line connecting corners C1 and C3 and a diagonal line connecting corners C4 and C5. Read electrodes 321B and 322B are further formed so that they are insulated from each other. Accordingly, an edge of an area of each read electrode covering pixel 310 forms a tilt angle with a charge moving direction. However, if the present configuration is applied to the first exemplary embodiment, the boundary does not form a tilt angle with a charge moving direction.

Figure 9:
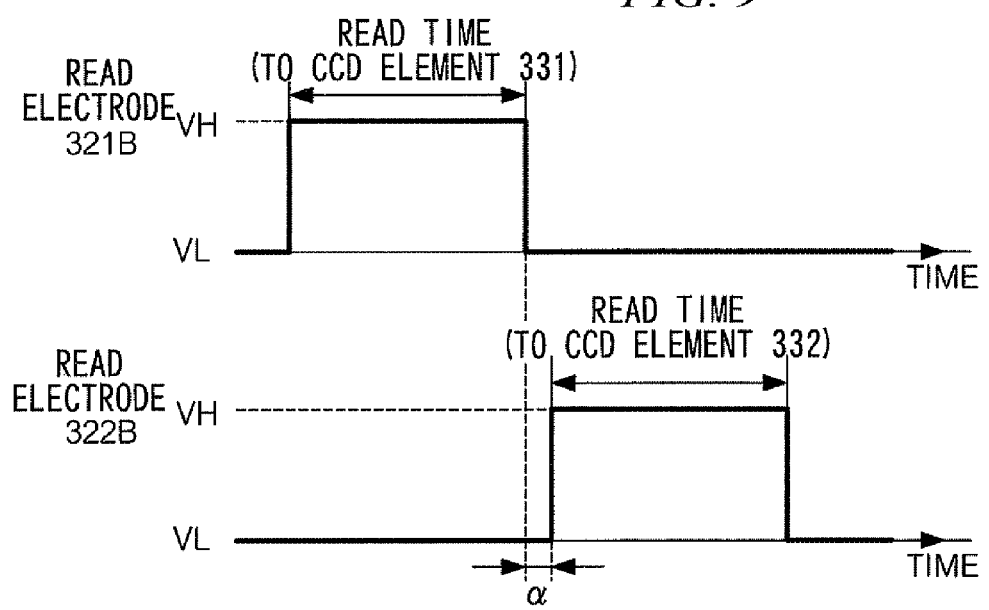
FIG. 9 is a diagram showing a change over time in a voltage applied to electrode unit 32B according to a third exemplary embodiment.

FIG. 9 is a diagram showing a change over time of a voltage applied from voltage apply unit 70 to read electrodes 321B and 322B under control of controller 80. As shown in the drawing, if voltage VH is applied to read electrode 321B, and voltage VL is applied to read electrode 323B, a potential gradient is generated, that has an even slope extending in a charge moving direction indicated by arrow DR7. Subsequently, if voltage VL is applied to read electrode 322B, and voltage VH is applied to read electrode 323B, a potential gradient is generated, that has an even slope extending in a charge moving direction indicated by arrow DR8. Namely, by switching a voltage to change a direction of a potential gradient, charges stored in pixel 310 are caused to move to one of CCD elements 331 and 332, whichever is nearer, for each charge (in a charge moving direction indicated by arrow DR7 or DR8). It is to be noted that time α is spared after voltage VH is applied to read electrode 321B and before the same voltage is applied to read electrode 322B so that an identical voltage is simultaneously applied to read electrodes 321B and 322B.

The foregoing is a description of exemplary embodiments of the present invention. The exemplary embodiments may be modified as described below.

<Modification 1>

In the above exemplary embodiments, where CCD elements 331 and 332 are arranged on both sides of pixels 310, CCD elements may be arranged on only one side of pixels 310. For example, in the third exemplary embodiment shown in FIG. 8A, CCD elements 332 may be omitted, as shown in FIG. 10.

Figure 10:
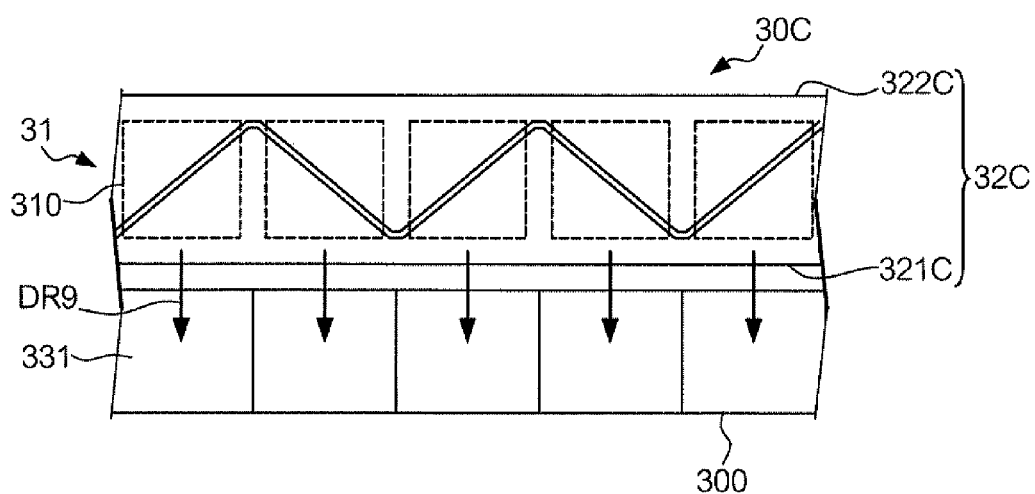
FIG. 10 is a diagram showing an overview of line sensor 30C according to modification 1.

FIG. 10 is a diagram showing an overview of line sensor unit 30C according to modification 1. In this case, if voltage VH is applied to read electrode 321C, and voltage VL is applied to read electrode 322C, a potential gradient is generated, that has an even slope extending from pixel 310 to CCD element 331. As a result, charges stored in pixel 310 are caused to move in a charge moving direction indicated by arrow DR9.

<Modification 2>

In the above modification 1, where two read electrodes 321C and 322C are used, only one read electrode may be used. For example, in modification 1 shown in FIG. 10, read electrode 322C may be omitted, as shown in FIG. 11.

Figure 11:
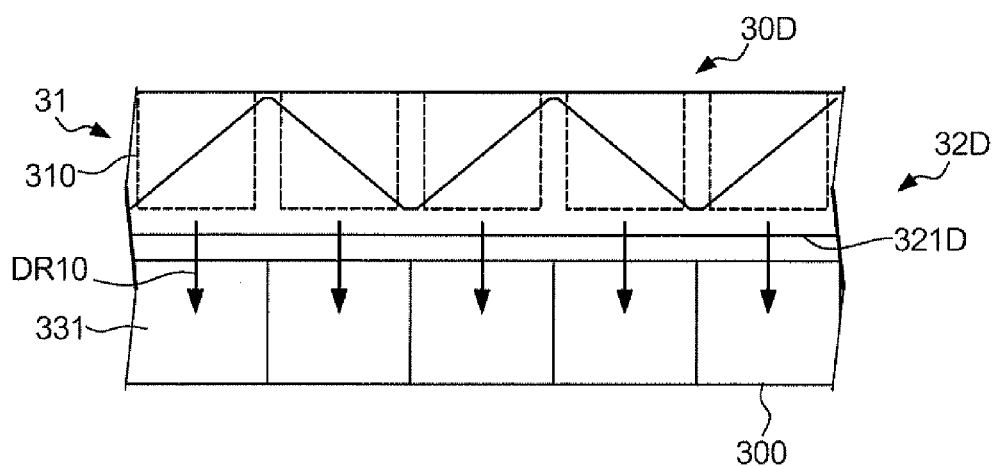
FIG. 11 is a diagram showing an overview of line sensor 30D according to modification 2.

FIG. 11 is a diagram showing an overview of line sensor unit 30D according to modification 2. In this case, if voltage VH is applied to read electrode 321D, a potential gradient is generated, which has an even slope extending from pixel 310 to CCD element 331. As a result, charges stored in pixel 310 are caused to move in a charge moving direction indicated by arrow DR 10.

<Modification 3>

In the above exemplary embodiments, where pixel 310 has a shape of a quadrangle, pixel 310 may have a shape of a polygon other than a quadrangle, or a shape of a circle. Pixel 310 may have any shape as long as an end of the pixel at the side of a CCD element is covered by a read electrode to which voltage VH is applied, and a part of the pixel is covered by a read electrode to which voltage VL is applied, which is formed away from the CCD element relative to the read electrode to which voltage VH is applied. Also, an edge of an area of a read electrode covering pixel 310 may form a tilt angle with a charge moving direction. As an example, an arrangement of read electrodes in an image sensor in which octagonal pixels are arranged in a honeycomb shape will be described.

Figure 12A:
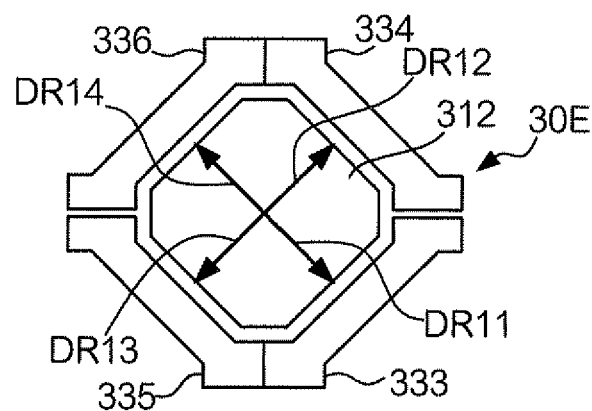
FIGS. 12A and 12B are diagrams showing an example of a configuration of image sensor unit 30E in which pixels are arranged in a honeycomb shape.
Figure 12B:
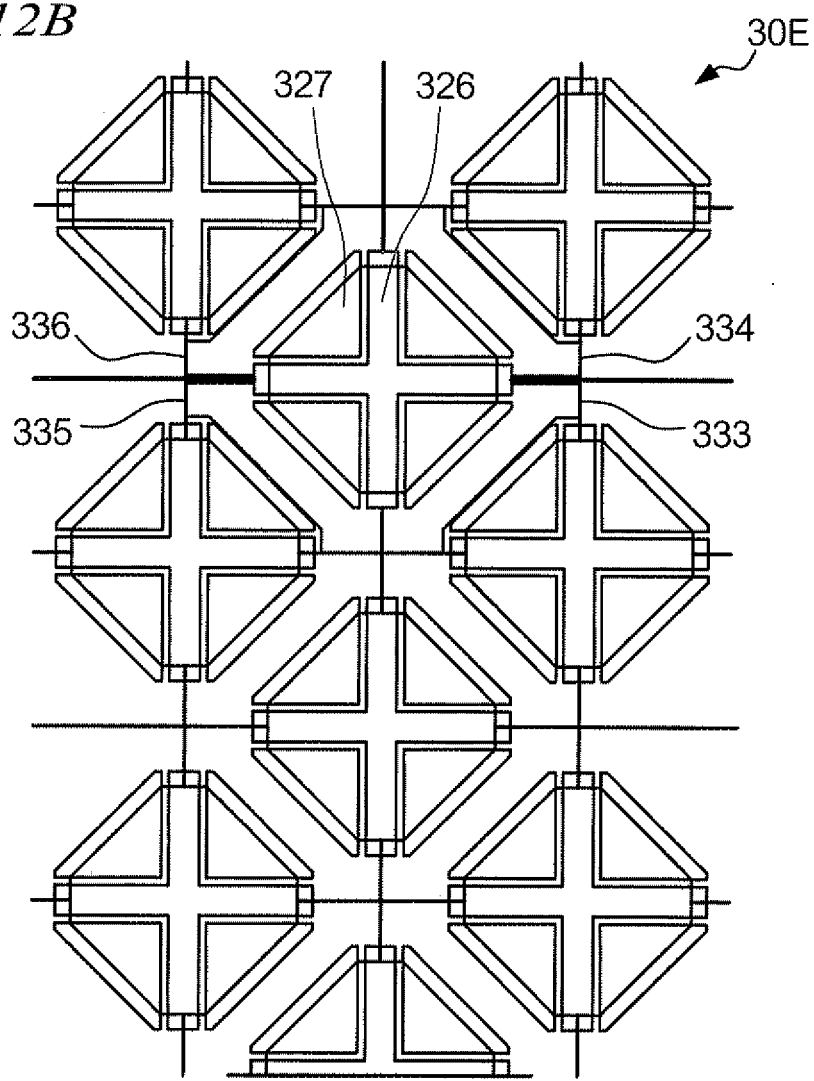

FIGS. 12A and 12B are diagrams showing an example of a configuration of image sensor unit 30E in which pixels are arranged in a honeycomb shape. FIG. 12A shows pixel 312 having an octagonal shape. Pixel 312 is surrounded by four CCD elements 333, 334, 335, and 336. In the case of pixel 312, charges stored therein move in a charge moving direction indicated by arrow DR11, DR12, DR13, or DR14. FIG. 12B shows an image sensor in which octagonal pixels including pixel 312 are arranged in a honeycomb shape. In the image sensor, optically transparent read electrode 326 and four read electrodes 327 are formed so that they cover pixel 312. Each read electrode 327 is formed so that it covers an end of pixel 312 perpendicular to a charge moving direction (DR11, DR12, DR13, or DR14), and an edge of an area of the read electrode covering pixel 312 forms a tilt angle with a charge moving direction (DR11, DR12, DR13, or DR14). Read electrode 326 is formed so that it is surrounded by read electrodes 327, and has a cross-like shape.

In image sensor unit 30E, if pixel 312 is irradiated, charges generated by a photoelectric conversion are stored in a pixel potential well. Subsequently, if voltage VL is applied to read electrode 326, a read potential of read electrode 326 becomes higher than a potential at the bottom of the pixel potential well. Subsequently, if voltage VH is applied to read electrode 327, a read potential of read electrode 327 becomes lower than a potential at the bottom of the pixel potential well. As a result, a potential gradient is generated, with a read potential of read electrode 326 at the top, that has even slopes extending in charge moving directions indicated by DR11, DR12, DR13, and DR14.

<Modification 4>

In the above exemplary embodiments, the present invention is implemented as line sensor unit 30 in which pixels 310 are arranged in a line. However, the present invention may be applied to an image sensor in which pixels 310 are arranged in plural lines, as long as the image sensor is configured so that charges stored in pixel 310 can be moved to CCD element 331 or 332.

<Modification 5>

In the above exemplary embodiments, for example in the second exemplary embodiment where the whole side of pixel 310 at the side of CCD element 331 or 332 is covered by read electrode 321A or 322A, only a part of a side of pixel 310 may be covered.

<Modification 6>

In the above exemplary embodiments, for example in the second exemplary embodiment where an edge of an area of read electrodes 321A, 322A, and 323A covering pixel 310 forms a tilt angle with a charge moving direction (DR5 or DR6), the angle may be 90 degrees, as in the case of the first exemplary embodiment.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An image sensor comprising:
    a charge generating unit deposited within a semiconductor substrate, that generates a charge in response to light, and has a potential well that stores the charge;
    a first charge storage unit provided directly on the semiconductor substrate next to the charge generating unit, facing a first aspect of the charge generating unit and separated from the charge generating unit by a portion of the semiconductor substrate, the first charge storage unit having a potential well deeper than the potential well of the charge generating unit and storing a charge transferred from the charge generating unit;
    a first electrode covering an end of the charge generating unit having the first aspect, to which a voltage is applied, to form a gradient of a potential in an area between the charge generating unit and the first charge storage unit so that a charge stored in the charge generating unit is transferred to the first charge storage unit; and
    a second electrode covering a part of the charge generating unit, and provided away from the first charge storage unit as compared with the first electrode, to which a voltage is applied to form a gradient of a potential in the area provided away from the first charge storage unit, wherein
    the first electrode and second electrode are disposed on a first insulating layer deposited on the surface of the semiconductor substrate,
    a second insulating layer is disposed over the first electrode, the second electrode, and the first insulating layer, and
    a third electrode, to which a voltage is applied to make a part of the potential well of the charge generating unit shallow, the shallow part corresponding to the part of the charge generating unit covered by the third electrode, wherein the third electrode is disposed on the second insulating layer, a portion of the third electrode being disposed above and overlapping a topmost portion of the first electrode and a topmost portion of the second electrode, and covers the middle portion of the charge generating unit between the first electrode and the second electrode, and the second insulating layer having an opening formed therein located beneath a center portion of the third electrode.

2. The image sensor according to claim 1, wherein at least one of the first electrode and the second electrode is formed so that at least part of an edge of an area of the electrode covering the charge generating unit forms an angle ranging from approximately 0 degree to approximately 90 degrees.

3. The image sensor according to claim 2, further comprising a second charge storage unit provided on the semiconductor substrate next to the charge generating unit, facing a second aspect of the charge generating unit, the second aspect being opposite the first aspect, the second charge storage unit having a potential well deeper than the potential well of the charge generating unit and storing a charge transferred from the charge generating unit, wherein:
    the second electrode is configured to cover an end of the charge generating unit that has the second aspect; and
    when a voltage is applied to the first electrode to make a part of the potential well of the charge generating unit shallow, the shallow part corresponding to the end of the charge generating unit covered by the first electrode, a voltage is applied to the second electrode to form a gradient of a potential in an area between the charge generating unit and the second charge storage unit so that a charge stored in the charge generating unit is transferred to the second charge storage unit.

4. An image-reading device comprising:
the image sensor according to claim 3;
a voltage apply unit applies a voltage to the first electrode and the second electrode;
a generation unit that generates image data representing an image on the basis of charges stored in the first charge storage unit or the second charge storage unit; and
a voltage controller that:
causes the voltage apply unit to apply a voltage to the first electrode to form a gradient of a potential in an area between the charge generating unit and the first charge storage unit so that a charge stored in the charge generating unit is transferred to the first charge storage unit;
causes the voltage apply unit to apply a voltage to the second electrode to make a part of the potential well of the charge generating unit shallow, the shallow part corresponding to the part of the charge generating unit covered by the second electrode;
causes the voltage apply unit to apply a voltage to the second electrode to form a gradient of a potential in an area between the charge generating unit and the second charge storage unit so that a charge stored in the charge generating unit is transferred to the second charge storage unit; and
causes the voltage apply unit to apply a voltage to the first electrode to make a part of the potential well of the charge generating unit shallow, the shallow part corresponding to the end of the charge generating unit covered by the first electrode.

5. An image-reading device comprising:
the image sensor according to claim 2;
a voltage apply unit applies a voltage to the first electrode and the second electrode;
a generation unit that generates image data representing an image on the basis of charges stored in the first charge storage unit; and
a voltage controller that causes the voltage apply unit to apply a voltage to the first electrode to form a gradient of a potential in an area between the charge generating unit and the first charge storage unit so that a charge stored in the charge generating unit is transferred to the first charge storage unit, and causes the voltage apply unit to apply a voltage to the second electrode to make part of the potential well of the charge generating unit shallow, the shallow part corresponding to the part of the charge generating unit covered by the second electrode.

6. The image sensor according to claim 1, further comprising a second charge storage unit provided on the semiconductor substrate next to the charge generating unit, facing a second aspect of the charge generating unit, the second aspect being opposite the first aspect, the second charge storage unit having a potential well deeper than the potential well of the charge generating unit and storing a charge transferred from the charge generating unit, wherein:
the second electrode is configured to cover an end of the charge generating unit that has the second aspect; and
when a voltage is applied to the first electrode to make a part of the potential well of the charge generating unit shallow, the shallow part corresponding to the end of the charge generating unit covered by the first electrode, a voltage is applied to the second electrode to form a gradient of a potential in an area between the charge generating unit and the second charge storage unit so that a charge stored in the charge generating unit is transferred to the second charge storage unit.

7. An image-reading device comprising:
the image sensor according to claim 6;
a voltage apply unit applies a voltage to the first electrode and the second electrode;
a generation unit that generates image data representing an image on the basis of charges stored in the first charge storage unit or the second charge storage unit; and
a voltage controller that:
causes the voltage apply unit to apply a voltage to the first electrode to form a gradient of a potential in an area between the charge generating unit and the first charge storage unit so that a charge stored in the charge generating unit is transferred to the first charge storage unit;
causes the voltage apply unit to apply a voltage to the second electrode to make a part of the potential well of the charge generating unit shallow, the shallow part corresponding to the part of the charge generating unit covered by the second electrode;
causes the voltage apply unit to apply a voltage to the second electrode to form a gradient of a potential in an area between the charge generating unit and the second charge storage unit so that a charge stored in the charge generating unit is transferred to the second charge storage unit; and
causes the voltage apply unit to apply a voltage to the first electrode to make a part of the potential well of the charge generating unit shallow, the shallow part corresponding to the end of the charge generating unit covered by the first electrode.

8. An image-reading device comprising:
the image sensor according to claim 1;
a voltage apply unit applies a voltage to the first electrode and the second electrode;
a generation unit that generates image data representing an image on the basis of charges stored in the first charge storage unit; and
a voltage controller that causes the voltage apply unit to apply a voltage to the first electrode to form a gradient of a potential in an area between the charge generating unit and the first charge storage unit so that a charge stored in the charge generating unit is transferred to the first charge storage unit, and causes the voltage apply unit to apply a voltage to the second electrode to make part of the potential well of the charge generating unit shallow, the shallow part corresponding to the part of the charge generating unit covered by the second electrode.

9. The image sensor according to claim 1, wherein a width of the third electrode is less than a width of the charge generating unit.

10. The image sensor according to claim 1, wherein before a voltage is applied to the first electrode and the second electrode,
a read potential of the first electrode and a read potential of the second electrode is higher than a potential at a bottom of the potential well of the charge generating unit.

11. The image sensor according to claim 1, further comprising a second charge storage unit provided on the semiconductor substrate next to the charge generating unit, facing a second aspect of the charge generating unit, the second aspect being opposite the first aspect, the second charge storage unit having a potential well deeper than the potential well of the charge generating unit and storing a charge transferred from the charge generating unit, wherein when a first voltage is applied to the first electrode and the second electrode,
a read potential of the first electrode and a read potential of the second electrode is higher than a potential at a bottom of the potential well of the first charge storage unit and a potential at a bottom of the potential well of the second charge storage unit, respectively, but lower than a potential at a bottom of the potential well of the charge generating unit.

12. The image sensor according to claim 1, further comprising a second charge storage unit provided on the semiconductor substrate next to the charge generating unit, facing a second aspect of the charge generating unit, the second aspect being opposite the first aspect, the second charge storage unit having a potential well deeper than the potential well of the charge generating unit and storing a charge transferred from the charge generating unit, wherein
when a first voltage is applied to the first electrode and the second electrode, and a second voltage is applied to the third electrode,
a read potential of the first electrode and a read potential of the second electrode is higher than a potential at a bottom of the potential well of the first charge storage unit and a potential at a bottom of the potential well of the second charge storage unit, respectively, but lower than a potential at a bottom of the potential well of the charge generating unit, and
a read potential of the third electrode is higher than the potential at the bottom of the potential well of the charge generating unit.

13. An image sensor comprising:
a charge generating means deposited within a semiconductor substrate, for generating a charge in response to light, the charge generating means having a potential well that stores the charge;
a first charge storage means provided directly on the semiconductor substrate next to the charge generating means, facing a first aspect of the charge generating means and separated from the charge generating means by a portion of the semiconductor substrate, the first charge storage means having a potential well deeper than the potential well of the charge generating means and storing a charge transferred from the charge generating means;
a first electricity-conducting means covering an end of the charge generating means having the first aspect, to which a voltage is applied, to form a gradient of a potential in an area between the charge generating means and the first charge storage means so that a charge stored in the charge generating means is transferred to the first charge storage means; and
a second electricity-conducting means covering a part of the charge generating means, and provided away from the first charge storage means as compared with the first electricity-conducting means, to which a voltage is applied to form a gradient of a potential in the area provided away from the first charge storage means make, wherein
the first electricity-conducting means and second electricity-conducting means are disposed on a first insulating layer deposited on the surface of the semiconductor substrate,
a second insulating layer is disposed over the first electricity-conducting means, the second electricity-conducting means, and the first insulating layer, and
a third electricity-conducting means, to which a voltage is applied to make a part of the potential well of the charge generating means shallow, the shallow part corresponding to the part of the charge generating means covered by the third electricity-conducting means, wherein the third electricity-conducting means is disposed on the second insulating layer, a portion of the third electricity-conducting means being disposed above and overlapping a topmost portion of the first electricity-conducting means and a topmost portion of the second electricity-conducting means, wherein the third electricity-conducting means covers the middle portion of the charge generating means between the first electricity-conducting means and the second electricity-conducting means, and the second insulating layer having an opening formed therein located beneath a center portion of the third electricity-conducting means.

14. The image sensor according to claim 13, wherein a width of the third electricity-conducting means is less than a width of the charge generating means.

15. The image sensor according to claim 13, wherein before a voltage is applied to the first electricity-conducting means and the second electricity-conducting means,
a read potential of the first electricity-conducting means and a read potential of the second electricity-conducting means is higher than a potential at a bottom of the potential well of the charge generating means.

16. The image sensor according to claim 13, further comprising a second charge storage means provided on the semiconductor substrate next to the charge generating means, facing a second aspect of the charge generating means, the second aspect being opposite the first aspect, the second charge storage means having a potential well deeper than the potential well of the charge generating means and storing a charge transferred from the charge generating means, wherein
when a first voltage is applied to the first electricity-conducting means and the second electricity-conducting means,
a read potential of the first electricity-conducting means and a read potential of the second electricity-conducting means is higher than a potential at a bottom of the potential well of the first charge storage means and a potential at a bottom of the potential well of the second charge storage means, respectively, but lower than a potential at a bottom of the potential well of the charge generating means.

17. The image sensor according to claim 13, further comprising a second charge storage means provided on the semiconductor substrate next to the charge generating means, facing a second aspect of the charge generating means, the second aspect being opposite the first aspect, the second charge storage means having a potential well deeper than the potential well of the charge generating means and storing a charge transferred from the charge generating means, wherein
when a first voltage is applied to the first electricity-conducting means and the second electricity-conducting means, and a second voltage is applied to the third electricity-conducting means,
a read potential of the first electricity-conducting means and a read potential of the second electricity-conducting means is higher than a potential at a bottom of the potential well of the first charge storage means and a potential at a bottom of the potential well of the second charge storage means, respectively, but lower than a potential at a bottom of the potential well of the charge generating means, and a read potential of the third electricity-conducting means is higher than the potential at the bottom of the potential well of the charge generating means.

18. An image sensor comprising:

a plurality of charge generating units deposited within a semiconductor substrate, each charge generating unit (i) generating a charge in response to light, (ii) having a potential well that stores the generated charge, (iii) being separated from one another by a portion of the semiconductor substrate, and (iv) being sequentially arranged with one another so as to form a line extending longitudinally along a length of the semiconductor substrate in a first direction;

a first charge storage unit provided directly on the semiconductor substrate next to the plurality of charge generating units, facing a first aspect of the plurality of charge generating units and separated from the plurality of charge generating units by a portion of the semiconductor substrate, the first charge storage unit having a potential well deeper than the potential wells of the plurality of charge generating units and storing a charge transferred from the plurality of charge generating units;

a first electrode covering an end of the plurality of charge generating units having the first aspect, to which a voltage is applied, to form a gradient of a potential in an area between the plurality of charge generating units and the first charge storage unit so that a charge stored in the plurality of charge generating units is transferred to the first charge storage unit;

a second electrode covering a part of the plurality of charge generating units, and provided away from the first charge storage unit as compared with the first electrode, to which a voltage is applied to form a gradient of a potential in the area provided away from the first charge storage unit; and a third electrode, to which a voltage is applied to make a part of the potential well of the charge generating unit shallow, the shallow part corresponding to the part of the charge generating unit covered by the third electrode, wherein the third electrode is disposed covering a middle portion of the plurality of charge generating units between the first electrode and the second electrode, and a width of the third electrode being less than a width of the plurality of charge generating units, respectively, wherein the first charge storage unit, the first electrode, the second electrode, and the third electrode each extend longitudinally in the first direction, parallel to one another, the first electrode and second electrode are disposed on a first insulating layer deposited on the surface of the semiconductor substrate, a second insulating layer is disposed over the first electrode, the second electrode, and the first insulating layer, and the third electrode is disposed on the second insulating layer, a portion of the third electrode being disposed above and overlapping a topmost portion of the first electrode and a topmost portion of the second electrode, and the second insulating layer having an opening formed therein located beneath a center portion of the third electrode.

19. The image sensor according to claim 18, wherein before a voltage is applied to the first electrode and the second electrode, a read potential of the first electrode and a read potential of the second electrode is higher than a potential at a bottom of the potential well of the charge generating unit.

20. The image sensor according to claim 18, further comprising a second charge storage unit provided on the semiconductor substrate next to the charge generating unit, facing a second aspect of the charge generating unit, the second aspect being opposite the first aspect, the second charge storage unit having a potential well deeper than the potential well of the charge generating unit and storing a charge transferred from the charge generating unit, wherein when a first voltage is applied to the first electrode and the second electrode, a read potential of the first electrode and a read potential of the second electrode is higher than a potential at a bottom of the potential well of the first charge storage unit and a potential at a bottom of the potential well of the second charge storage unit, respectively, but lower than a potential at a bottom of the potential well of the charge generating unit.

21. The image sensor according to claim 18, further comprising a second charge storage unit provided on the semiconductor substrate next to the charge generating unit, facing a second aspect of the charge generating unit, the second aspect being opposite the first aspect, the second charge storage unit having a potential well deeper than the potential well of the charge generating unit and storing a charge transferred from the charge generating unit, wherein when a first voltage is applied to the first electrode and the second electrode, and a second voltage is applied to the third electrode, a read potential of the first electrode and a read potential of the second electrode is higher than a potential at a bottom of the potential well of the first charge storage unit and a potential at a bottom of the potential well of the second charge storage unit, respectively, but lower than a potential at a bottom of the potential well of the charge generating unit, and a read potential of the third electrode is higher than the potential at the bottom of the potential well of the charge generating unit.

* * * * *